United States Patent
Kubo et al.

(10) Patent No.: US 9,331,261 B2
(45) Date of Patent: May 3, 2016

(54) PIEZOELECTRIC ELEMENT

(71) Applicant: PANASONIC CORPORATION, Osaka (JP)

(72) Inventors: Takashi Kubo, Osaka (JP); Toshinari Noda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 445 days.

(21) Appl. No.: 14/057,738

(22) Filed: Oct. 18, 2013

(65) Prior Publication Data

US 2014/0159549 A1   Jun. 12, 2014

(30) Foreign Application Priority Data

Dec. 10, 2012 (JP) ................................. 2012-269053

(51) Int. Cl.
*H01L 41/047* (2006.01)
*H01L 41/187* (2006.01)
*H01L 41/08* (2006.01)

(52) U.S. Cl.
CPC ........ *H01L 41/0478* (2013.01); *H01L 41/0815* (2013.01)

(58) Field of Classification Search
CPC ................................. H01B 3/12; H01G 7/023
USPC ...... 310/358, 363–365; 252/62.9 R, 62.9 PZ; 501/134
See application file for complete search history.

(56) References Cited

U.S. PATENT DOCUMENTS

| | | | |
|---|---|---|---|
| 6,232,242 B1 * | 5/2001 | Hata | .................. C23C 14/3407 257/E21.274 |
| 2004/0053460 A1 * | 3/2004 | Higuchi | ............ H01L 21/31691 438/200 |
| 2010/0014143 A1 | 1/2010 | Kanno et al. | |
| 2011/0101828 A1 | 5/2011 | Noda et al. | |

FOREIGN PATENT DOCUMENTS

| | | |
|---|---|---|
| JP | 2010-026069 A | 2/2010 |
| JP | 2012-018944 A | 1/2012 |
| JP | 2012-169400 A | 9/2012 |
| WO | 2009157189 A1 | 12/2009 |

* cited by examiner

*Primary Examiner* — Thomas Dougherty
(74) *Attorney, Agent, or Firm* — McDermott Will & Emery LLP (57) ABSTRACT

A piezoelectric element includes, in sequence, a substrate containing metallic material; a first intermediate layer; a lower electrode layer; a piezoelectric layer; and an upper electrode layer. The first intermediate layer contains, as a main component, a nitrogen-containing silicon oxide having a silicon-nitrogen bond. The lower electrode layer contains a perovskite-type oxide in (100) preferential orientation. The piezoelectric layer contains a perovskite-type oxide in (001) or (100) preferential orientation.

6 Claims, 6 Drawing Sheets

PIEZOELECTRIC ELEMENT

BACKGROUND

1. Technical Field

The technical field relates to piezoelectric elements which can perform electromechanical transduction.

2. Background Art

A piezoelectric element contains an oxide ferroelectric thin film having excellent ferroelectric, piezoelectric, pyroelectric, and electro-optic properties. Well-known examples of such oxides include those having a perovskite structure with a general formula $ABO_3$. Oxide ferroelectric thin films have been used as effective materials for a wide range of devices such as various types of sensors, actuators, and memories. Their application will probably be further expanded in the future.

Oxide ferroelectrics are typified by lead zirconate titanate (PZT) having a general formula of $Pb(Zr_x, Ti_{1-x})O_3$ where $0<x<1$. PZT is a solid solution of $PbZrO_3$ and $PbTiO_3$ each having a perovskite structure. When Zr in $PbZrO_3$ is continuously replaced by Ti, the crystal undergoes a phase transition from rhombohedral to tetragonal in the composition near Zr/Ti=53/47. This phase boundary is called the morphotropic phase boundary, and it is known that in the composition near the boundary, physical constants such as relative permittivity and piezoelectric constant become maximum. A PZT thin film has different physical constants depending on the orientation direction thereof. In other words, a PZT thin film is subjected to different distortions depending on the direction in which an electric field is applied. For example, applying an electric field in the axial direction called a polarization axis causes a large distortion. In a tetragonal PZT thin film, the polarization axis is in the c-axis direction ((001) direction), which is the longitudinal axis of the crystal lattice. Aligning the molecules in the crystal lattice in this direction (called "orientation control") provides the PZT thin film with a high piezoelectric constant. PZT thin films are also known to have excellent linearity in the piezoelectric constant (the linearity of the amount of displacement with respect to the applied electric field).

A PZT thin film can be prepared by various methods including vapor phase growth methods such as deposition, sputtering, chemical vapor deposition (CVD), and liquid phase growth methods such as chemical solution deposition (CSD). Among these, the CSD process is a non-vacuum process and can therefore be performed with low cost. The CSD process can also prepare a precursor solution that is homogeneous on the molecular level, and is therefore easy to control the composition of the PZT thin film. Furthermore, it is possible to use spin coating, which makes the composition and thickness of the film uniform in the plane and provides high reproducibility. With spin coating, a film can be easily formed even on a large substrate.

A PZT thin film is generally formed on a Pt (111) layer, which is formed as a lower electrode layer on a silicon (Si) substrate in consideration of the consistency with the semiconductor process. Silicon, however, is too brittle to be used as a material for diaphragms in actuator devices and cracks may cause in silicon and the piezoelectric element may easily be broken. To avoid this problem, in applications requiring long-term reliability in operation, it is effective that the substrate is made of metallic materials such as stainless steel, titanium, nickel, molybdenum, or copper, or tough metallic material such as special steel or an alloy containing these metals. Examples of these application include drive elements for scanning-type projectors, and vibrating mirror elements for optical and RF switches. Among the above-mentioned metallic materials, those having a low Young's modulus, such as titanium, nickel, molybdenum, copper, and alloys containing them can be used for the diaphragms of actuator devices in order to provide a large amount of displacement.

SUMMARY

Piezoelectric elements according to various exemplary embodiments each include, in sequence, a substrate containing metallic material; a first intermediate layer; a lower electrode layer; a piezoelectric layer; and an upper electrode layer. The first intermediate layer contains, as a main component, a nitrogen-containing silicon oxide having a silicon-nitrogen bond. The lower electrode layer contains a perovskite-type oxide in (100) preferential orientation. The piezoelectric layer contains a perovskite-type oxide in (001) or (100) preferential orientation.

DESCRIPTION OF EMBODIMENTS

Prior to describing exemplary embodiments, problems in conventional piezoelectric elements will now be described as follows. In a conventional piezoelectric element, the substrate is made of metallic material having a low Young's modulus, such as titanium. On the titanium substrate, a Pt (111) layer is formed as a lower electrode layer, and a PZT layer is formed as a piezoelectric layer on the Pt (111) layer. In this configuration, the PZT layer is not highly (001)-oriented, and hence does not have high piezoelectric properties. A suggested approach to solving this problem is to provide an orientation control layer between the piezoelectric layer and the lower electrode layer. When, however, a metal, for example, titanium is used for the substrate, elements contained in the substrate diffuse during the formation of the orientation control layer. This diffusion may cause the composition variation of the orientation control layer, or inhibit the crystal growth of the orientation control layer. Therefore, it is difficult to achieve a PZT layer that has high crystallinity and is (001)-oriented.

Piezoelectric elements of exemplary embodiments will now be described as follows with reference to drawings. The piezoelectric elements include, a substrate containing metallic material, and a piezoelectric layer that is excellent in crystallinity and piezoelectric properties.

First Exemplary Embodiment

Figure 1:
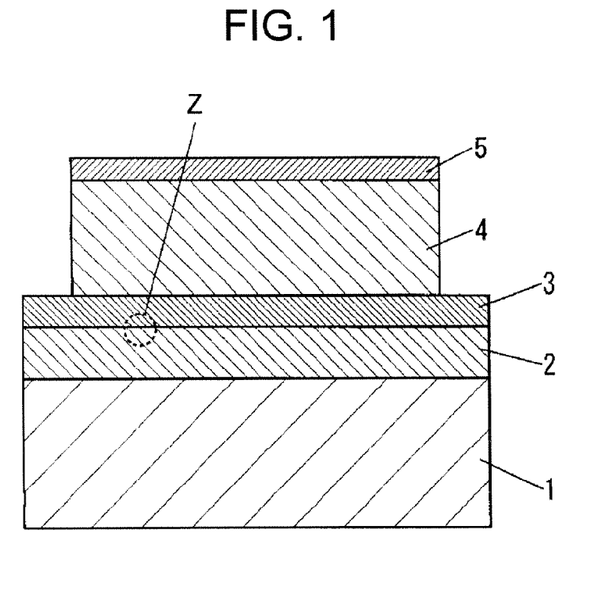
FIG. 1 is a sectional view of a piezoelectric element according to a first exemplary embodiment.

FIG. 1 is a sectional view of a configuration example of a piezoelectric element according to the first exemplary embodiment. The piezoelectric element includes substrate 1, and the following layers formed on at least one main surface of substrate 1 in this order: first intermediate layer 2, lower electrode layer 3, piezoelectric layer 4, and upper electrode layer 5. Substrate 1 can contain metallic material, for example, titanium. Examples of other metallic materials besides titanium include special steels and alloys containing, for example, nickel, molybdenum, and copper.

First intermediate layer 2 contains, as a main component, a nitrogen-containing silicon oxide having a silicon-nitrogen bond. This configuration can prevent metallic elements of substrate 1 from diffusing to lower electrode layer 3. Here, containing the nitrogen-containing silicon oxide as the main component indicates that first intermediate layer 2 contains 50% by volume or more of the nitrogen-containing silicon oxide.

Lower electrode layer 3 contains a perovskite-type oxide in (100) preferential orientation. For example, lower electrode layer 3 is formed of lanthanum nickelate (LaNiO$_3$, hereinafter, LNO) as a main component, and is formed on first intermediate layer 2 which is formed on substrate 1. Lower electrode layer 3 contains 80% by volume or more of LNO. Here, containing LNO as the main component indicates that lower electrode layer 3 contains 50% by volume or more of LNO.

LNO has a rhombohedral perovskite structure with space group R3c. In LNO with a rhombohedral crystal structure, $a_0$=0.5461 nm ($a_0$=$a_p$), and $\alpha$=60°, whereas in LNO with a pseudo-cubic crystal structure, $a_0$=0.384 nm. LNO has a resistivity of $1\times10^{-3}$ ($\Omega\cdot$cm) at room temperature, and metallic electro conductivity. As another feature, LNO is not made to undergo a transition from a metallic electroconductive state to an insulating state by temperature change.

The materials containing LNO as a main component include materials in which part of nickel is replaced by another metal. The substitution metal is at least one metal selected from the group consisting of iron, aluminum, manganese, and cobalt. Specific examples of the substitution metal include LaNiO$_3$—LaFeO, LaNiO$_3$—LaAlO$_3$, LaNiO$_3$—LaMnO$_3$, and LaNiO$_3$—LaCoO$_3$. If needed, it is also possible to use a material in which part of nickel is replaced by two or more metals.

Piezoelectric layer 4 is formed of a perovskite-type oxide in (001) or (100) preferential orientation. Piezoelectric layer 4 contains, as a main component, for example, lead zirconate titanate (hereinafter, PZT) with rhombohedral or tetragonal in (001) orientation. Here, containing PZT as the main component indicates that piezoelectric layer 4 contains 80% by volume or more of PZT. Piezoelectric layer 4 may be changed to be in (100)-oriented by changing the relationship of coefficient of thermal expansion between substrate 1 and piezoelectric layer 4.

PZT has a composition of Zr/Ti=53/47 near the phase boundary (morphotropic phase boundary) between tetragonal and rhombohedral phases. Besides Zr/Ti=53/47, the composition of PZT needs only to be in the range of 30/70≤Zr/Ti≤70/30. The material of piezoelectric layer 4 is not limited to PZT only, but at least one metal in trace amounts selected from the group consisting of Sr, Nb, and Al may be added and the elements constituting PZT may be partially replaced by the metal.

Tetragonal PZT used in the present exemplary embodiment has lattice constants of a=b=0.4036 nm, and c=0.4146 nm in bulk ceramics. Pseudo-cubic LNO, on the other hand, has a lattice constant of a=0.384 nm. Thus, the a-axis of LNO with the pseudo-cubic structure approximates the a- and c-axes of PZT in length. As a result, the (100) plane of LNO is well lattice-matched to the (001) and (100) planes of PZT.

The term "lattice matching" here indicates the lattice matching between the unit lattice of PZT and the unit lattice of LNO. It has been reported that, in general, when a crystal plane is exposed to a surface of a crystal, the crystal lattice of the crystal and the crystal lattice of a film to be formed on the crystal are promoted to match each other, thereby forming epitaxial crystal nuclei at the boundary.

It is preferable that the difference between the lattice constant of the (001) or (100) plane of piezoelectric layer 4 and the lattice constant of the main orientation plane of lower electrode layer 3 be about 10% or less in absolute value. In this range, piezoelectric layer 4 can be highly (001)- or (100)-oriented.

Upper electrode layer 5 is made, for example, of 0.3 μm-thick gold (Au). Besides Au, upper electrode layer 5 can be made of a conductive material, and has preferably a thickness in the range of 0.1 μm to 0.5 μm.

A method of manufacturing the piezoelectric element according to the present exemplary embodiment will now be described as follows. First, a precursor solution to form first intermediate layer 2 is applied to substrate 1 and formed into a coated film. Then, the solvent is evaporated to convert the coated film into a nitrogen-containing silicon oxide. This results in the formation of first intermediate layer 2. Next, an LNO precursor solution to form lower electrode layer 3 is applied to first intermediate layer 2, and is formed into an LNO precursor film by evaporating the solvent and pyrolyzing organic residuals. Next, substrate 1 having first intermediate layer 2 and the LNO precursor film formed thereon in that order is rapidly heated to crystallize the LNO precursor film. This results in the formation of lower electrode layer 3. Next, a PZT precursor solution is applied to lower electrode layer 3 and is formed into a PZT precursor film by evaporating the solvent and pyrolyzing organic residuals. Then, substrate 1 having first intermediate layer 2, lower electrode layer 3, and the PZT precursor film formed thereon in that order is rapidly heated to crystallize the PZT precursor film. This results in the formation of piezoelectric layer 4. Finally, upper electrode layer 5 is formed on piezoelectric layer 4.

Each process in the manufacturing the piezoelectric element will now be described in detail, starting with the process of forming first intermediate layer 2. First, a precursor solution to form first intermediate layer 2 is applied to substrate 1 by spin coating. In spin coating, the number of revolutions per unit time can be controlled to form a thin film having an in-plane uniform thickness.

First intermediate layer 2 is made from a precursor solution containing polysilazane, which is substantially only composed of inorganic materials. For example, the precursor solution may contain, as a main component, perhydro-polysilazane (hereinafter, PHPS) with a general formula of $(SiH_2NH)_n$ which is an inorganic compound polymer composed of silicon, nitrogen, and hydrogen. Besides perhydropolysilazane, one example of the polysilazane-based precursor solution substantially not containing any organic material is polyborosilazane (PBS) with a general formula of $(SiH_2NB)_n$.

The precursor solution that contains PHPS as the main component will now be described as follows. This precursor solution is either a solution having PHPS dissolved in an organic solvent, or a suspension having PHPS dispersed in an organic solvent.

The organic solvent in which PHPS is dissolved can be any kind, and preferable examples of the solvent include petroleum-derived solvents typified by alkyl-substituted benzenes such as xylene, benzene, toluene, and ethylbenzene. The organic solvent can be used either alone or together with other kinds.

If needed, the precursor solution may contain additives such as a hydrolysis or dehydration-polymerization regulator, a reaction accelerator, and an anti-setting agent.

Examples of the hydrolysis or dehydration-polymerization regulator include amine-based catalysts such as ammonia and trimethylamine, and palladium catalysts at a view point of preparing a nitrogen-containing silicon oxide at room temperature. These catalysts are preferable because they increase the reaction rate.

The precursor solution that contains PHPS as the main component can be applied to substrate 1 by other known methods than spin coating, such as dip coating, spray coating, and roll coating.

Next, the coated film is left at temperatures in the range of 0 to 50° C. comparatively close to room temperature, so that first intermediate layer 2 is formed which contains a nitrogen-containing silicon oxide as the main component. The following processes are repeated until first intermediate layer 2 has an expected thickness: applying the precursor solution that contains PHPS as the main component to substrate 1, and leaving the coated film near room temperature. While the coated film is left near room temperature, the solvent in the film is evaporated so that polysilazane can be converted into a nitrogen-containing silicon oxide. The temperature at which the solvent is evaporated to convert polysilazane into a nitrogen-containing silicon oxide is not particularly limited, and preferably in the range of 0 to 50° C. The time during which the coated film is left can be a few hours, but it is preferable to wait for a few days to a few weeks to complete the conversion of polysilazane into a nitrogen-containing silicon oxide.

The polysilazane-based precursor solution that is substantially only composed of inorganic materials contains few organic substances after the coated film is dried near room temperature. This means that the film obtained by leaving the coated film of the precursor solution near room temperature is formed of an inorganic material that contains a nitrogen-containing silicon oxide as a main component. This configuration prevents metallic elements contained in substrate 1 from diffusing to lower electrode layer 3 during the subsequent heat treatment, and consequently, provides lower electrode layer 3 that is highly crystal-oriented.

Alternatively, first intermediate layer 2 may be formed by other methods than leaving the coated film in air atmosphere near room temperature. The atmosphere in which the coated film is left may an inert atmosphere such as argon and nitrogen, or a reducing atmosphere such as hydrogen and carbon monoxide, for example.

It is preferable that first intermediate layer 2 have a thickness of 0.30 µm or more and less than 1.0 µm. If the film thickness is less than 0.30 µm, first intermediate layer 2 may not be sufficiently densified, possibly causing titanium contained in substrate 1 to diffuse to lower electrode layer 3. If titanium diffuses to lower electrode layer 3, the crystal growth is inhibited, and the crystallinity is decreased in lower electrode layer 3. If the film thickness is 1.0 µm or more, on the other hand, first intermediate layer 2 may suffer cracking, microcracking, or chipping.

The following is a description of the process of forming lower electrode layer 3. The LNO precursor solution for forming lower electrode layer 3 composed of LNO, is applied to first intermediate layer 2. An example of forming the LNO layer by the CSD process will now be described as follows.

As raw materials for the LNO precursor solution, lanthanum nitrate hexahydrate $(La(NO_3)_3.6H_2O)$ and nickel acetate tetrahydrate $(CH_3COO)_2Ni.4H_2O)$ can be used. 2-methoxy ethanol and 2-amino ethanol can be used as the solvent.

The LNO precursor solution is prepared from the raw materials, and is applied to first intermediate layer 2 by spin coating so as to be formed into an LNO precursor film. The LNO precursor film is heated at 100 to 200° C. to be dried, and is then heated at 300 to 400° C. so that organic residuals are pyrolyzed. The processes of applying the LNO precursor solution to the first intermediate layer and of pyrolyzing the organic residuals are repeated a plurality of times until an LNO precursor film having an expected thickness is completed.

After this, substrate 1 having first intermediate layer 2 and the LNO precursor film formed thereon in that order is rapidly heated in a rapid thermal annealing furnace (hereinafter, RTA furnace) to crystallize the LNO precursor film. This crystallization treatment is performed at a temperature of 600° C. or above for a few minutes at a temperature rise rate of 100 to 300° C./min. Instead of the CSD process, lower electrode layer 3 made of an LNO-based material may be formed by other known methods such as a vapor phase growth method like sputtering, or a hydrothermal synthesis method.

Figure 2:
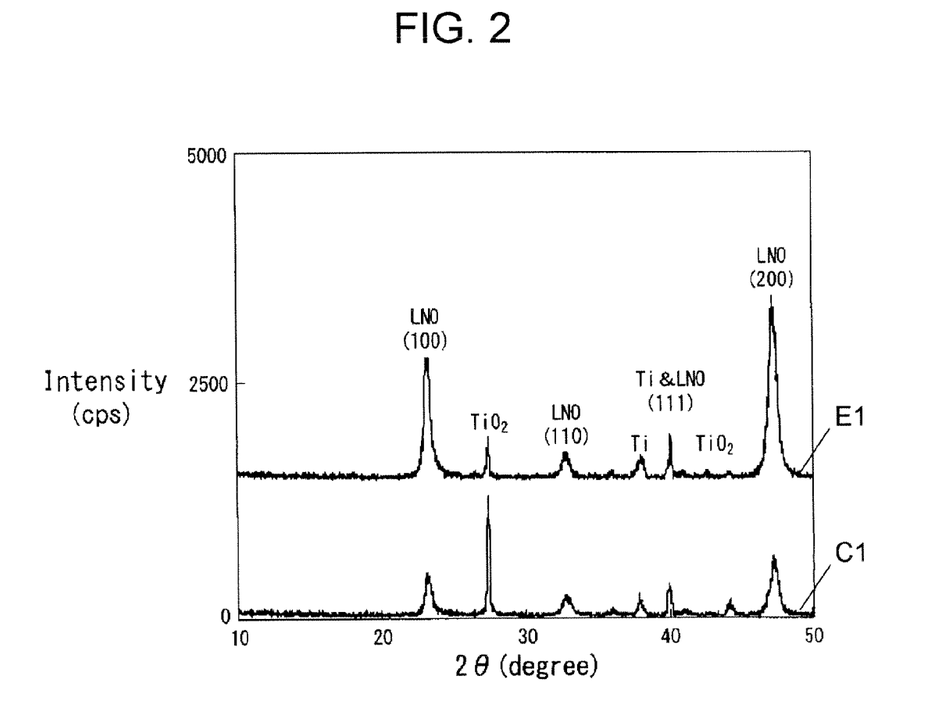
FIG. 2 is an X-ray diffraction pattern of a lower electrode layer in the range of $10°≤2θ≤50°$ in the piezoelectric element according to the first exemplary embodiment.

Hereinafter, the crystal orientation by X-ray diffraction of LNO layer prepared in the present exemplary embodiment is evaluated, and the evaluation results are shown in FIG. 2. FIG. 2 also shows, for comparison, the case of preparing a silicon oxide layer (first intermediate layer) from a precursor solution that contains tetraethoxysilane (hereinafter, TEOS) having a general formula of $Si(OC_2H_5)_4$ as a main component. The nitrogen-containing silicon oxide layer prepared from the precursor solution that contains PHPS as the main component is hereinafter referred to as the "$SiO_2$ (PHPS) layer". The silicon oxide layer prepared from the precursor solution that contains TEOS as the main component is hereinafter referred to as the "$SiO_2$ (TEOS) layer". In FIG. 2, a pattern E1 indicates the measurement result of the LNO layer formed on the $SiO_2$ (PHPS) layer, whereas a pattern C1 indicates that of the LNO layer formed on the $SiO_2$ (TEOS) layer.

A method of preparing the $SiO_2$ (TEOS) layer will now be described as follows. First, a precursor solution that contains TEOS as the main component is applied to substrate 1 by spin coating. Then, the coated film is dried by being heated at 150° C. for 10 minutes. This operation removes the physically-adsorbed moisture in the coated film. It is preferable that the temperature in this operation be over 100° C. and less than 200° C. If the temperature is 200° C. or above, the organic residuals in the coated film start to be decomposed. If the decomposition proceeds together with water removal, the film becomes porous. After being heated, the film is further heated at 500° C. for ten minutes so as to be densified as a result of the pyrolysis of the organic residuals. The series of operations from applying the precursor solution to substrate 1 until drying and densifying the coated film are repeated a plurality of times until the film has an expected thickness, thereby completing the SiO$_2$ (TEOS) layer.

As shown in FIG. 2, when the first intermediate layer is formed of SiO$_2$ (TEOS) as shown in the pattern C1, the diffraction peak of LNO is observed, but its intensity is low. The reason for this is considered that the heat treatment has caused the titanium contained in the substrate to diffuse to the SiO$_2$ (TEOS) layer and further to the LNO layer and the diffused titanium inhibits the crystal growth of the LNO layer.

On the other hand, when the first intermediate layer 2 is formed of SiO$_2$ (PHPS) as shown in the pattern E1, the LNO layer formed on first intermediate layer 2 has a higher diffraction peak of LNO than the LNO layer formed on the SiO$_2$ (TEOS) layer.

Assume that the (100) orientation of the LNO layer formed on the SiO$_2$ (PHPS) layer is $\alpha(100)=I(100)/(I(100)+I(111)+I(110))\times 100$, where I is an X-ray diffraction intensity. In this case, $\alpha(100)=90\%$, indicating that the LNO layer is highly (100)-oriented.

As described above, the SiO$_2$ (PHPS) layer is left near room temperature during the process of forming first intermediate layer 2. As a result, first intermediate layer 2 is formed of an inorganic nitrogen-containing silicon oxide, and has a high barrier function against the diffusion of titanium. In addition, because first intermediate layer 2 is left near room temperature, the titanium contained in the substrate is prevented from diffusing into first intermediate layer 2. Thus, in the process of preparing the LNO layer, the titanium is prevented from diffusing to the LNO layer.

On the other hand, in the case of forming the first intermediate layer as the SiO$_2$ (TEOS) layer, it is necessary to remove organic components by a heat treatment at 500° C. The film during the heat treatment has a low barrier property to the diffusion of titanium because it contains a large amount of organic components. As a result, while the LNO layer is being prepared, the titanium is considered to be diffused onto the SiO$_2$ (TEOS) layer, and further, into the LNO layer.

Figure 3:
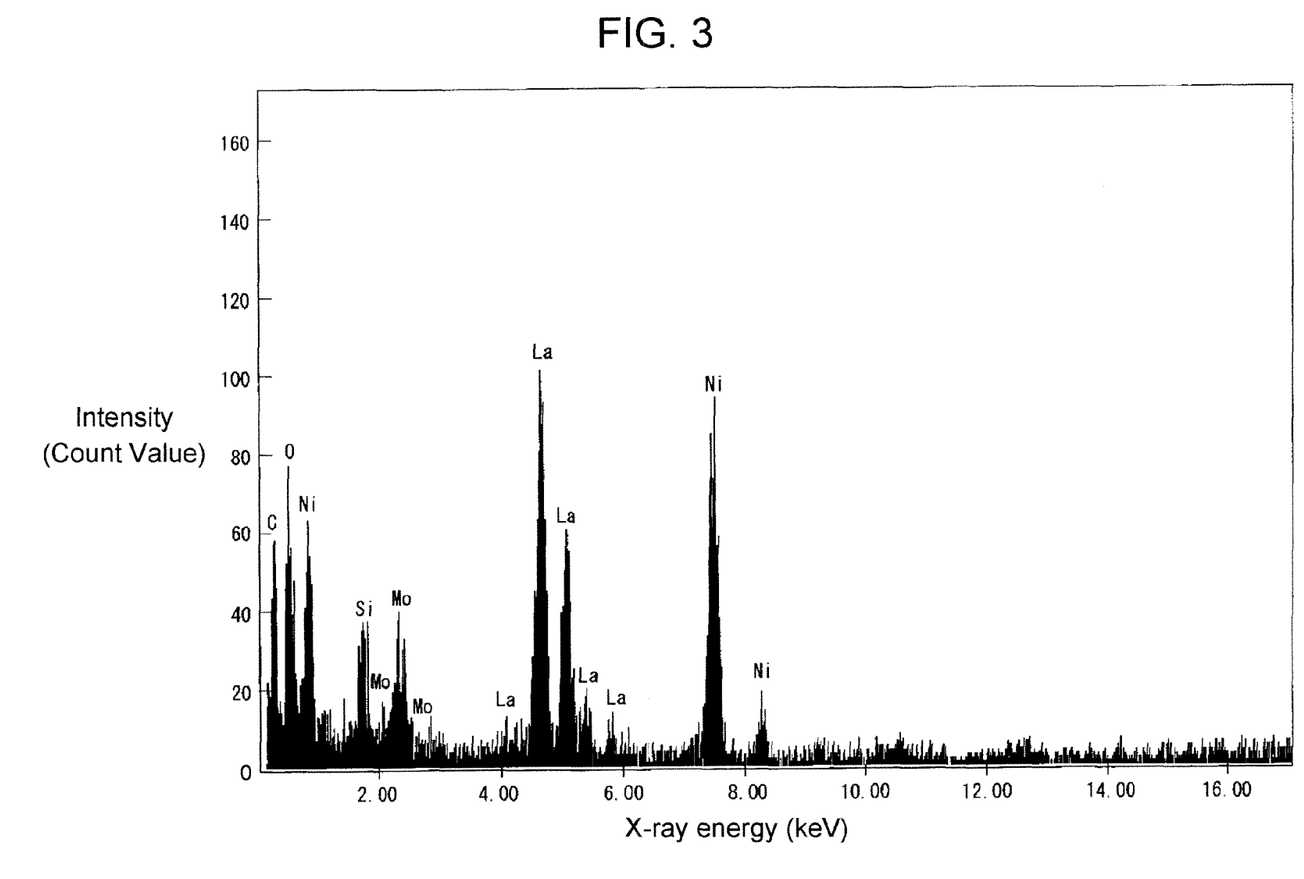
FIG. 3 shows EDX analysis results near the boundary between a first intermediate layer and the lower electrode layer in the piezoelectric element according to the first exemplary embodiment.

Next, the results of the cross sectional elemental analysis of the piezoelectric element according to the present exemplary embodiment will now be described with reference to FIG. 3. The elemental analysis is performed by energy dispersive X-ray spectrometry (EDX). FIG. 3 shows EDX analysis results in a region Z which is near the boundary between first intermediate layer 2 and lower electrode layer 3 shown in FIG. 1. In this analysis, an electron beam is applied to a cross section of a thin piece of the piezoelectric element. The analysis results shown in FIG. 3 exhibit the detection of Mo, but this detection of Mo comes from the Mo grid used as a specimen support.

FIG. 3 indicates that titanium diffusion to the LNO layer has been prevented, which is obvious from the fact that there is no detection of the titanium contained in the substrate near the boundary between the SiO$_2$ (PHPS) layer used as first intermediate layer 2 and the LNO layer used as lower electrode layer 3.

In FIG. 2, the peaks of titanium and its oxides are observed. However, in the measurements from which these results have been obtained, an X-ray is applied to the surface of lower electrode layer 3 on first intermediate layer 2, which is formed on substrate 1. An incident X-ray beam is known to penetrate to a certain depth and to be diffracted by the lattice at the depth. The results shown in FIG. 2 are considered to be due to the titanium contained in substrate 1 and the titanium oxides present on the surface of substrate 1. The same holds true for FIGS. 6A and 8A, which will be described later.

The process of forming piezoelectric layer 4 on lower electrode layer 3 will now be described as follows. The raw materials for the PZT layer, which is to be piezoelectric layer 4, are lead(II) acetate trihydrate (Pb(OCOCH$_3$)$_2$.3H$_2$O), titanium isopropoxide (Ti(OCH(CH$_3$)$_2$)$_4$), and zirconium n-propoxide (Zr(OCH$_2$CH$_2$CH$_3$)$_4$). As the solvent, ethanol is used.

The PZT precursor solution is prepared from the raw materials, and is applied to lower electrode layer 3 by spin coating so as to be formed into a PZT precursor film. The PZT precursor film is heated at 100° C. or above to be dried, and is then heated at 300° C. or above so that organic residuals are pyrolyzed. The processes of applying the PZT precursor solution to lower electrode layer 3 and of pyrolyzing the organic residuals are repeated a plurality of times until a PZT precursor film having an expected thickness is completed.

After this, the PZT precursor film is crystallized in the RTA furnace. This crystallization treatment is performed at a temperature of 500° C. or above for a few minutes at a temperature rise rate of 100 to 300° C./min. It is preferable that the crystallization temperature is 500° C. or above and less than 750° C. If the temperature is 750° C. or above, the Pb contained in the PZT precursor film becomes deficient as a result of evaporation, and consequently, the resultant PZT layer has low crystallinity. After these processes, a highly (001)-oriented PZT layer is completed.

In the above description, in the formation of the PZT layer, the expected film thickness is obtained by performing crystallization after repeating the solution application and the pyrolysis a plurality of times. Alternatively, however, the expected film thickness can be obtained by repeating the processes from the solution application to the crystallization a plurality of times.

Figure 4:
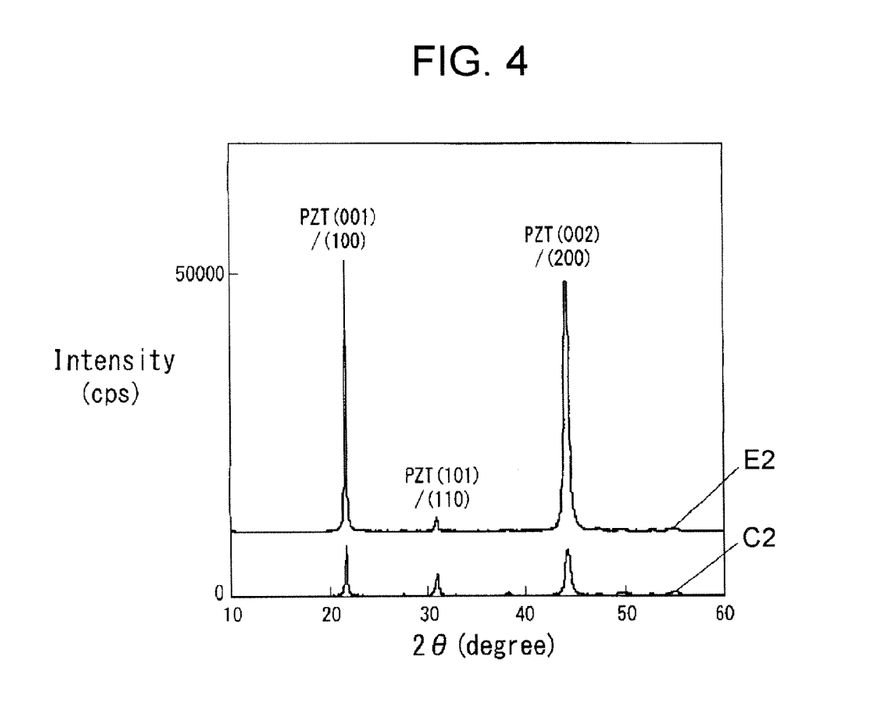
FIG. 4 is an X-ray diffraction pattern of a piezoelectric layer in the range of $10°≤2θ≤60°$ in the piezoelectric element according to the first exemplary embodiment.

Next, the X-ray diffraction results to evaluate the crystal orientation of the PZT layer as piezoelectric layer 4 prepared in the present exemplary embodiment will now be described with reference to FIG. 4. FIG. 4 is an X-ray diffraction pattern of the PZT layer as piezoelectric layer 4 in the range of $10°\leq 2\theta\leq 60°$. FIG. 4 also shows, for comparison, an X-ray diffraction pattern of the case of forming the SiO$_2$ (TEOS) layer as the first intermediate layer. A pattern E2 indicates the measurement results with the SiO$_2$ (PHPS) layer, whereas a pattern C2 indicates those with the SiO$_2$ (TEOS) layer.

As shown in FIG. 4, the PZT layer is preferentially (001)- and (100)-oriented in both cases of using the SiO$_2$ (PHPS) layer and the SiO$_2$ (TEOS) layer. A comparison of the diffraction peak intensity between the PZT layers in these cases indicates that the intensity is higher in the case of forming the SiO$_2$ (PHPS) layer (in the pattern E2) than in the case of forming the SiO$_2$ (TEOS) layer (in the pattern C2). The PZT layer also exhibits higher (001) and (100) orientations, namely about 96%, in the case of forming the SiO$_2$ (PHPS) layer. The reason for this is considered that the use of the SiO$_2$ (PHPS) layer allows an LNO layer formed thereon to be highly crystal-oriented, and accordingly allows a PZT layer formed further thereon to be highly crystal-oriented.

Figure 5:
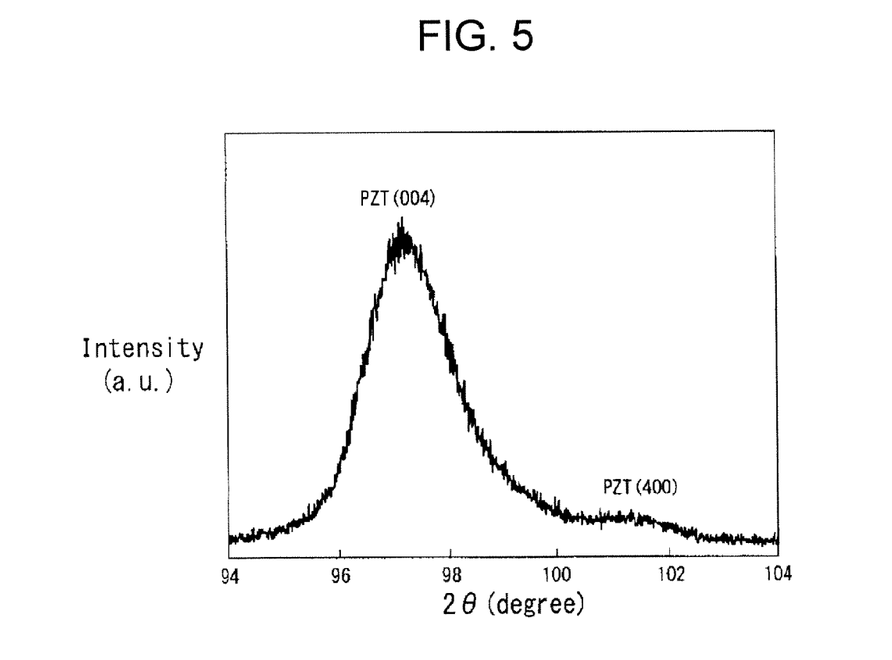
FIG. 5 is an X-ray diffraction pattern of the piezoelectric layer in the range of $94°≤2θ≤104°$ in the piezoelectric element according to the first exemplary embodiment.

FIG. 5 is an X-ray diffraction pattern of the PZT layer as piezoelectric layer 4 in the range of $94°\leq 2\theta\leq 104°$. In FIG. 5, a PZT (004) peak and a PZT (400) peak are observed. A comparison between these diffraction peak intensities indicates that the PZT (004) peak is higher than the PZT(400) peak. This indicates that the PZT layer is preferentially oriented in the (004) direction which is the polarization axis.

The following is a description of the results of electric characteristic evaluation of the PZT layer as piezoelectric layer 4 obtained when upper electrode layer 5 made of Au is formed thereon. Upper electrode layer 5 can be formed, for example, by ion beam deposition or resistance heating deposition.

Table 1 shows the results of remanent polarization (hereinafter, $P_r$) of the PZT layer as its electric characteristic.

"$P_r$" is known to be proportional to the piezoelectric property. In general, the larger the $P_r$ of a layer, the higher the piezoelectric property of the layer. The $P_r$ is measured with a ferroelectric tester (Radiant Technologies Inc., Precision LC) at room temperature and an applied AC voltage of 330 kV/cm. Table 1 also shows, for comparison, the case of forming the $SiO_2$ (TEOS) layer as the first intermediate layer.

TABLE 1

|  | $SiO_2$ (PHPS) layer | $SiO_2$ (TEOS) layer |
|---|---|---|
| remanent polarization $P_r$ ($\mu C/cm^2$) | 25 | 19 |

Table 1 indicates that the $P_r$ is larger in the case of forming the $SiO_2$ (PHPS) layer than in the case of forming the $SiO_2$ (TEOS) layer. The reason for this is considered that the use of the $SiO_2$ (PHPS) layer allows the PZT layer to have higher crystallinity, and hence, to be highly (001)-oriented.

According to the present exemplary embodiment, titanium diffusion from substrate 1 is prevented by forming first intermediate layer 2 on titanium-containing substrate 1. As a result, lower electrode layer 3 is formed of LNO with a highly crystal-orientation. Furthermore, the PZT layer formed on the LNO layer has much higher crystallinity than conventional PZT layers, and is (001)-oriented.

The following is a description of the case of applying a heat treatment to the $SiO_2$ (PHPS) layer in the preparation of first intermediate layer 2. It is preferable that substrate 1 having the $SiO_2$ (PHPS) layer formed thereon be heat-treated in an electric furnace in air atmosphere. This heat treatment densifies the $SiO_2$ (PHPS) layer. Except for the heat treatment, the structure and manufacturing process are similar to those described above, and hence the description thereof will be omitted.

The heat treatment is performed preferably at 300 to 800° C., and more preferably at 650 to 750° C. Instead of an air atmosphere, the heat treatment can be performed in an inert atmosphere such as argon or nitrogen, or in a reducing atmosphere such as hydrogen or carbon monoxide. Alternatively, a moisture-containing heating atmosphere can be used.

The heat-treated $SiO_2$ (PHPS) layer will hereinafter be referred to as the "$SiO_2$ (PHPS-HEAT) layer".

Figure 6A:
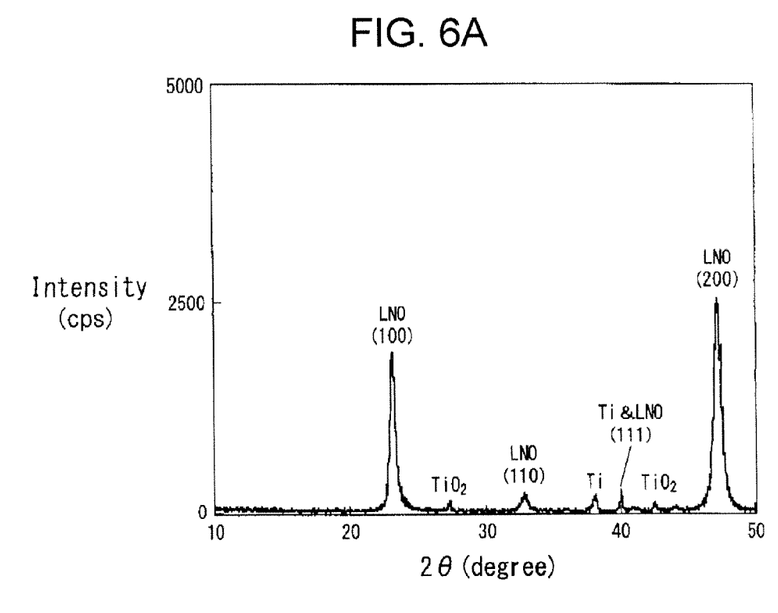
FIG. 6A is an X-ray diffraction pattern of a lower electrode layer in the range of $10°≤2θ≤50°$ in another piezoelectric element according to the first exemplary embodiment.
Figure 6B:
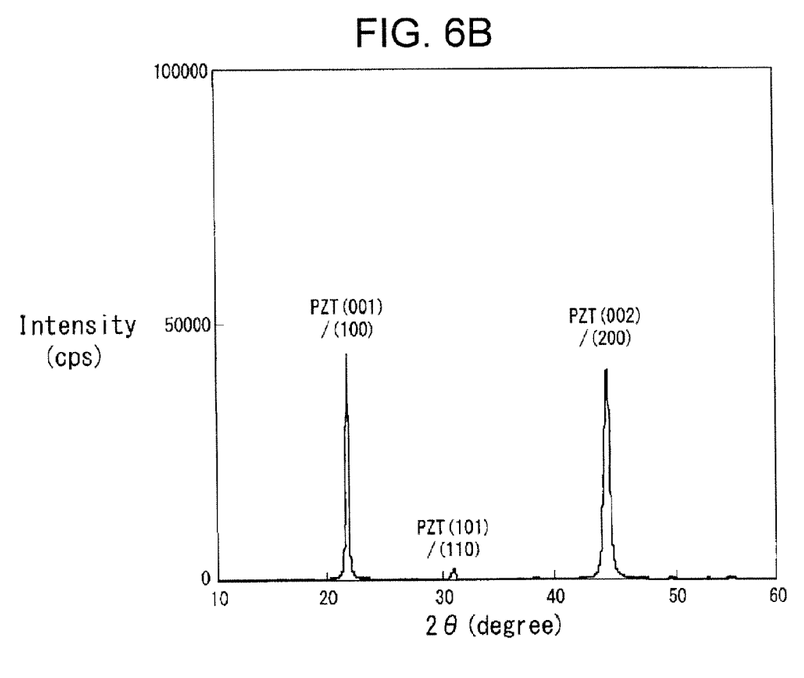
FIG. 6B is an X-ray diffraction pattern of a piezoelectric layer in the range of $10°≤2θ≤60°$ in the other piezoelectric element according to the first exemplary embodiment.

The following is a description of the X-ray diffraction results to evaluate the crystallinities and orientations of the LNO layer as lower electrode layer 3 and the PZT layer as piezoelectric layer 4 in the case of laminating the $SiO_2$ (PHPS-HEAT) layer as first intermediate layer 2, the LNO layer, and the PZT layer in that order.

FIG. 6A is an X-ray diffraction pattern of the above-formed LNO layer as lower electrode layer 3 in the range of 10°≤2θ≤50°. A comparison between FIG. 6A and the pattern E1 of FIG. 2 indicates that the LNO layer formed on the $SiO_2$ (PHPS-HEAT) layer has a higher diffraction peak intensity of LNO than the LNO layer formed on the $SiO_2$ (PHPS) layer. Furthermore, the LNO layer formed on the $SiO_2$ (PHPS-HEAT) layer exhibits a (100) orientation as high as α(100) =92%.

FIG. 6B is an X-ray diffraction pattern of the above-formed PZT layer as piezoelectric layer 4 in the range of 10°≤2θ≤60°. A comparison between FIG. 6B and the pattern E2 of FIG. 4 indicates that the diffraction peak intensity of PZT, or in other words, the crystallinity of PZT is higher in the case of forming the $SiO_2$ (PHPS-HEAT) layer than in the case of forming the $SiO_2$ (PHPS) layer as first intermediate layer 2. The PZT layer also exhibits higher (001) and (100) orientations, namely 98% in the case of forming the $SiO_2$ (PHPS-HEAT) layer. The reason for this is considered to be due to the high crystal orientation of the underlying LNO layer.

The following is a description of the evaluation results of the wettability of the $SiO_2$ (PHPS) layer and the $SiO_2$ (PHPS-HEAT) layer with respect to the LNO precursor solution. The wettability is evaluated by measuring, on each of the $SiO_2$ (PHPS) layer and the $SiO_2$ (PHPS-HEAT) layer, the contact angle (°) of 2-methoxy ethanol which is the solvent of the LNO precursor solution. The contact angle is measured by the sessile drop method, and the measurement results are shown in Table 2. The term "contact angle" here means an angle formed by a line tangent to a surface edge of a liquid and a solid surface when the liquid is in contact with the solid surface. The wettability increases with decreasing contact angle. The measurement is performed at room temperature by dropping 1 to 4 μL of 2-methoxy ethanol for one minute or less after the 2-methoxy ethanol is placed on a specimen.

TABLE 2

|  | $SiO_2$ (PHPS) layer | $SiO_2$ (PHPS-HEAT) layer |
|---|---|---|
| contact angle of 2-methoxy ethanol | 21.5° | 8.5° |

Table 2 indicates that the $SiO_2$ (PHPS-HEAT) layer has a smaller contact angle, or in other words, is more wettable to 2-methoxy ethanol than the $SiO_2$ (PHPS) layer. Thus, the heat treatment of accelerating the densification of the $SiO_2$ (PHPS) layer can improve its wettability to the LNO precursor solution. For this reason, the LNO layer can be highly crystal-oriented and consequently, the PZT layer can be highly crystal-oriented.

The solvent of the LNO precursor solution is not limited to 2-methoxy ethanol, which is used in the above-described experiment. Other examples of the solvent include 2-methoxy ethanol, 2-ethoxy ethanol, 2-propoxy ethanol, 2-butoxy ethanol, diethylene glycol monomethyl ether, diethylene glycol monoethyl ether, diethylene glycol monobutyl ether, dipropylene glycol monomethyl ether, dipropylene glycol monoethyl ether, and dipropylene glycol monobutyl ether. Thus, ether-based solvents can be used, and preferable among them are glycol ether-based solvents.

Table 3 shows the results of the $P_r$ of the PZT layer as its characteristic. Table 3 also shows, for comparison, the measurement results of the PZT layer in the case of forming the $SiO_2$ (PHPS) layer as first intermediate layer 2.

TABLE 3

|  | $SiO_2$ (PHPS-HEAT) layer | $SiO_2$ (PHPS) layer |
|---|---|---|
| remanent polarization $P_r$ ($\mu C/cm^2$) | 27 | 25 |

Table 3 indicates that the $P_r$ is larger in the piezoelectric element in the case of forming the $SiO_2$ (PHPS-HEAT) layer as first intermediate layer 2. The reason for this is considered that the PZT layer has higher crystal orientation than the PZT layer in the case of forming the $SiO_2$ (PHPS) layer as first intermediate layer 2.

Second Exemplary Embodiment

Figure 7:
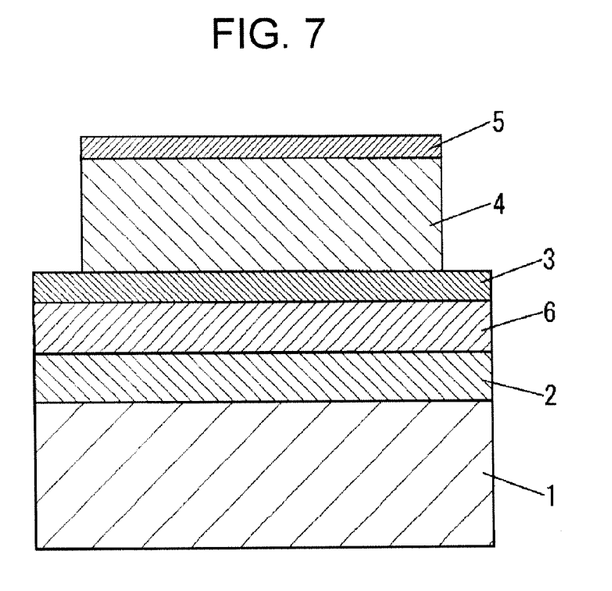
FIG. 7 is a sectional view of a piezoelectric element according to a second exemplary embodiment.

FIG. 7 is a sectional view of a configuration example of a piezoelectric element according to a second exemplary embodiment. The piezoelectric element includes substrate 1, and the following layers formed on substrate 1 in this order: first intermediate layer 2, second intermediate layer 6, lower electrode layer 3, piezoelectric layer 4, and upper electrode layer 5.

The piezoelectric element of the present exemplary embodiment is identical to that of the first exemplary embodiment except for including second intermediate layer 6, which is disposed between first intermediate layer 2 and lower electrode layer 3. Therefore, components identical to those in the first exemplary embodiment will be denoted by the same reference numerals, and the detailed description thereof will be omitted.

Second intermediate layer 6 is formed of a material having a smaller contact angle with the LNO precursor solution than that of first intermediate layer 2. In other words, second intermediate layer 6 has a higher wettability than first intermediate layer 2. In the following description, a $SiO_2$ (TEOS) layer as second intermediate layer 6 is prepared from a precursor solution that contains TEOS as a main component. However, second intermediate layer 6 may contain other materials that are more wettable to the LNO precursor solution than first intermediate layer 2. Examples of the other materials include oxides of titanium, aluminum, magnesium, hafnium, and other oxides containing them as a main component.

Second intermediate layer 6 can be formed by the CSD process or other known methods such as a hydrothermal synthesis method, and a vapor phase growth method like CVD or sputtering.

The LNO layer as lower electrode layer 3 is formed on the $SiO_2$ (TEOS) layer as second intermediate layer 6. The PZT layer as piezoelectric layer 4 is formed on lower electrode layer 3.

Figure 8A:
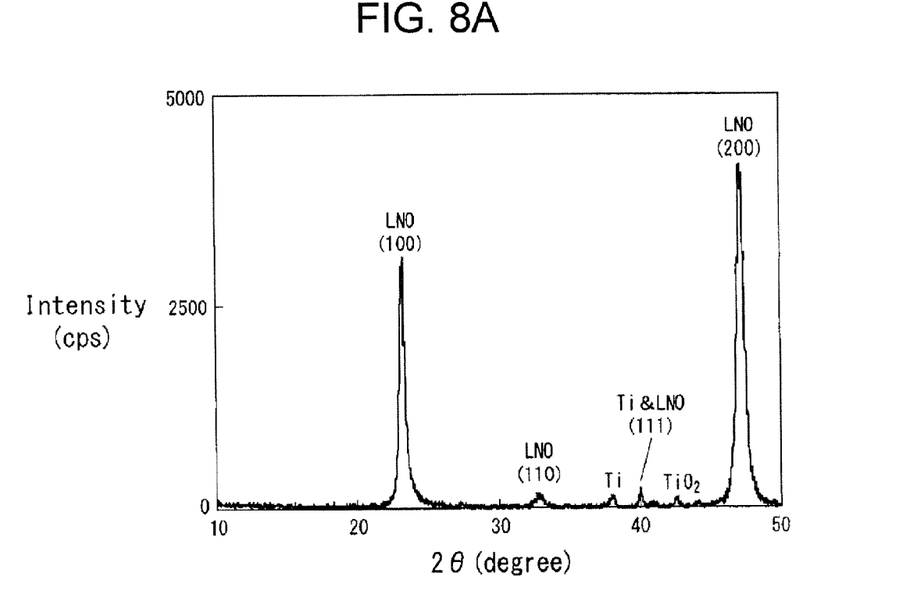
FIG. 8A is an X-ray diffraction pattern of a lower electrode layer in the range of $10°≤2θ≤50°$ in the piezoelectric element according to the second exemplary embodiment.
Figure 8B:
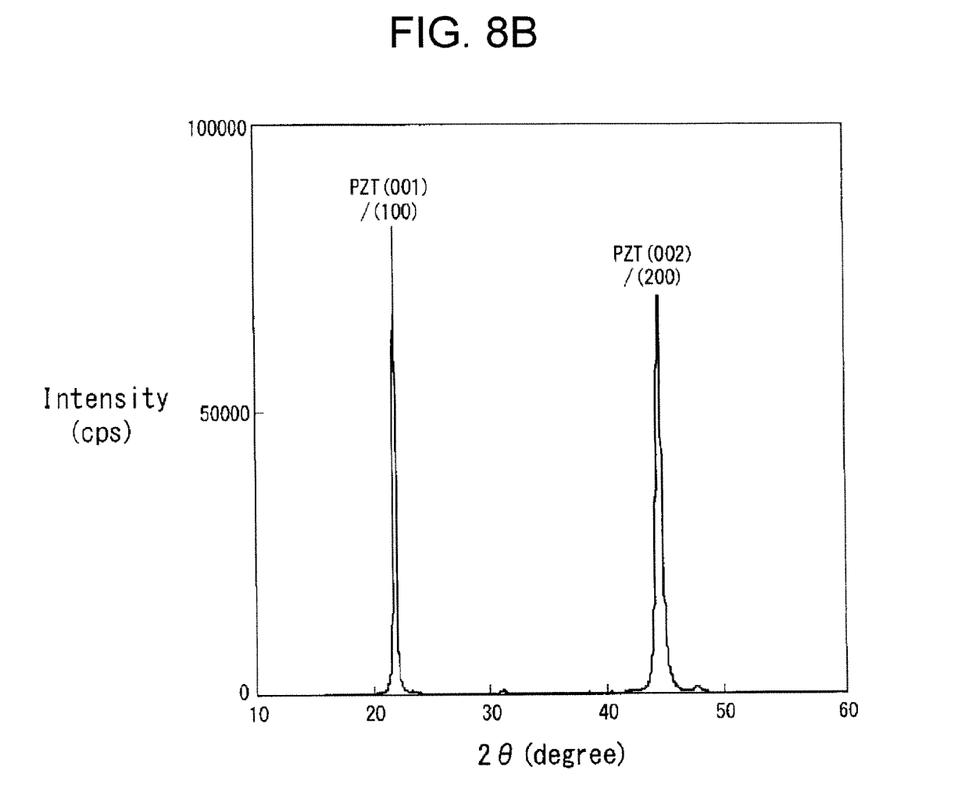
FIG. 8B is an X-ray diffraction pattern of a piezoelectric layer in the range of $10°≤2θ≤60°$ in the piezoelectric element according to the second exemplary embodiment.

The LNO layer and the PZT layer will now be evaluated for their crystal orientations by X-ray diffraction, and the evaluation results are described with reference to FIGS. 8A and 8B. FIG. 8A is an X-ray diffraction pattern of the LNO layer as lower electrode layer 3 in the range of $10°≤2θ≤50°$ according to the present exemplary embodiment. FIG. 8B is an X-ray diffraction pattern of the PZT layer as piezoelectric layer 4 in the range of $10°≤2θ≤60°$ according to the present exemplary embodiment.

A comparison between FIG. 8A, the pattern E1 of FIG. 2, and FIG. 6A indicates that the LNO layer of the present exemplary embodiment has a higher diffraction peak intensity of LNO than any LNO layer of the first exemplary embodiment. Furthermore, the LNO layer of the present exemplary embodiment exhibits a (100) orientation of as high as $α(100)=93\%$.

A comparison between FIG. 8B, the pattern E2 of FIG. 4, and FIG. 6B indicates that the PZT layer of the present exemplary embodiment has a much higher diffraction peak intensity of PZT, or in other words, higher crystallinity than any PZT layer of the first exemplary embodiment. Furthermore, the PZT layer of the present exemplary embodiment exhibits high (001) and (100) orientations, namely about 99%. The reason for this is considered that disposing the $SiO_2$ (TEOS) layer on first intermediate layer 2 provides a highly crystal-oriented LNO layer.

The following is a description of the evaluation results of the wettability of the $SiO_2$ (TEOS) layer and the $SiO_2$ (PHPS-HEAT) layer with respect to the LNO precursor solution. The wettability is evaluated by measuring, on each of the $SiO_2$ (TEOS) layer and the $SiO_2$ (PHPS-HEAT) layer, the contact angle (°) of 2-methoxy ethanol, which is the solvent of the LNO precursor solution. The contact angle is measured by the sessile drop method, and the measurement results are shown in Table 4. The measurement is performed at room temperature by dropping 1 to 4 μL of 2-methoxy ethanol for one minute or less after the 2-methoxy ethanol is placed on a specimen.

TABLE 4

|  | $SiO_2$ (TEOS) layer | $SiO_2$ (PHPS-HEAT) layer |
| --- | --- | --- |
| contact angle of 2-methoxy ethanol | 2.5° | 8.5° |

Table 4 indicates that the $SiO_2$ (TEOS) layer has a smaller contact angle, or in other words, is more wettable to 2-methoxy ethanol than the $SiO_2$ (PHPS-HEAT) layer. Thus, the use of the $SiO_2$ (TEOS) layer allows the LNO layer to be highly crystal-oriented, and accordingly allows the PZT layer to be highly crystal-oriented. As a result, it is preferable that the second intermediate layer has a smaller contact angle with respect to the solvent of the LNO precursor solution than the first intermediate layer.

Table 5 shows the results of the $P_r$ of the PZT layer prepared in the present exemplary embodiment as its characteristic. Table 5 also shows, for comparison, the measurement results of the PZT layer in the case of forming the $SiO_2$ (PHPS-HEAT) layer as the first intermediate layer in the first exemplary embodiment.

TABLE 5

|  | $SiO_2$ (PHPS-HEAT) layer | second exemplary embodiment |
| --- | --- | --- |
| remanent polarization $P_r$ (μC/cm²) | 27 | 29 |

Table 5 indicates that the PZT layer as piezoelectric layer 4 of the present exemplary embodiment has a larger $P_r$ than the PZT layer formed while using the $SiO_2$ (PHPS-HEAT) layer as the first intermediate layer. The reason for this is considered that the PZT layer prepared in the present exemplary embodiment has higher crystal orientation than the PZT layer prepared in the first exemplary embodiment.

In the first and second exemplary embodiments, titanium is taken as an example of the metallic elements that may diffuse from substrate 1 to lower electrode layer 3 and inhibit the crystal orientation of lower electrode layer 3. Other examples that may inhibit the crystal orientation of lower electrode layer 3 include iron, chromium, nickel, copper, molybdenum, and tungsten. These metallic elements, however, can be prevented from diffusing to lower electrode layer 3 by forming first intermediate layer 2 containing, as a main component, nitrogen-containing silicon oxide having a silicon-nitrogen bond.

Lower electrode layer 3 is an LNO layer in the first and second exemplary embodiments, but may be alternatively formed of other perovskite-type oxides such as $(La, Sr)CoO_3$, $(La, Sr)MnO_3$, and $SrRuO_3$. Each of these oxides has a high conductivity and a pseudo-cubic crystal structure, and are preferentially (100)-oriented. They have lattice constants of 0.383 nm, 0.387 nm, and 0.393 nm, respectively, and are well lattice-matched to piezoelectric layer 4, thereby providing similar effects to those in the first and second exemplary embodiments.

As described above, according to the first and second exemplary embodiments, first intermediate layer 2 can prevent the diffusion of metallic elements from substrate 1 to lower electrode layer 3, thereby allowing lower electrode layer 3 to be highly crystal-oriented. Lower electrode layer 3 functions as an orientation control layer for piezoelectric layer 4, allowing piezoelectric layer 4 to have a high piezoelectric property. In other words, lower electrode layer 3 provides a piezoelectric element with a piezoelectric layer having high polarization characteristics. This piezoelectric element is useful for various kinds of actuators such as a piezoelectric actuator and an ultrasonic motor, optical devices such as an optical scanner and an optical switch and the like.

What is claimed is:

1. A piezoelectric element comprising, in sequence:
   a substrate containing metallic material;
   a first intermediate layer containing, as a main component, a nitrogen-containing silicon oxide having a silicon-nitrogen bond;
   a lower electrode layer containing a perovskite-type oxide in (100) preferential orientation;
   a piezoelectric layer containing a perovskite-type oxide in (001) or (100) preferential orientation; and
   an upper electrode layer.

2. The piezoelectric element according to claim 1, wherein the substrate contains titanium.

3. The piezoelectric element according to claim 1, wherein the lower electrode layer is free from titanium.

4. The piezoelectric element according to claim 1, wherein the lower electrode layer contains lanthanum nickelate as a main component.

5. The piezoelectric element according to claim 1, wherein the piezoelectric layer contains lead zirconate titanate as a main component.

6. The piezoelectric element according to claim 1, further comprising a second intermediate layer disposed between the first intermediate layer and the lower electrode layer, the second intermediate layer having a smaller contact angle with an ether-based solvent than the first intermediate layer.

* * * * *